United States Patent
Antretter et al.

(10) Patent No.: US 7,286,433 B2
(45) Date of Patent: Oct. 23, 2007

(54) METHOD FOR ACTIVATING A PLURALITY OF WORD LINES IN A REFRESH CYCLE, AND ELECTRONIC MEMORY DEVICE

(75) Inventors: Richard Antretter, Stephanskirchen (DE); Manfred Moser, Dachau (DE)

(73) Assignee: Infineon Technologies AG, Munich (DE)

( * ) Notice: Subject to any disclaimer, the term of this patent is extended or adjusted under 35 U.S.C. 154(b) by 130 days.

(21) Appl. No.: 11/294,055

(22) Filed: Dec. 5, 2005

(65) Prior Publication Data

US 2006/0126414 A1     Jun. 15, 2006

(30) Foreign Application Priority Data

Dec. 10, 2004    (DE) .................... 10 2004 059 671

(51) Int. Cl.
*G11C 7/00*    (2006.01)
(52) U.S. Cl. .................... 365/222; 365/230.03
(58) Field of Classification Search ............... 365/222, 365/230.03, 230.08
See application file for complete search history.

(56) References Cited

U.S. PATENT DOCUMENTS 5,715,206 A * 2/1998 Lee et al. .................... 365/222
6,067,261 A * 5/2000 Vogelsang et al. .......... 365/201
6,469,947 B2 * 10/2002 Park .......................... 365/222
6,842,392 B2 * 1/2005 Mizugaki et al. ........... 365/222
6,940,775 B2    9/2005 Schneider et al.

FOREIGN PATENT DOCUMENTS

DE    10317364    11/2004
JP    0409 274    1/1991

OTHER PUBLICATIONS

German Office Action dated Oct. 12, 2005.

\* cited by examiner

*Primary Examiner*—Anh Phung
(74) *Attorney, Agent, or Firm*—Jenkins, Wilson, Taylor & Hunt, P.A.

(57) ABSTRACT

An electronic memory device for storing data comprises a memory cell array arranged in at least one memory bank and comprising memory cells in which information is stored. The electronic memory device further comprises word lines and bit lines for addressing and reading the memory cells of the memory cell array. The word lines are configured to refresh in a refresh mode the information stored in the memory cells of the memory cell area by applying a predetermined activation potential at a predetermined refresh rate to the word lines. All word lines of the memory bank which do not have a common bit line are activated simultaneously in the refresh mode.

9 Claims, 2 Drawing Sheets

METHOD FOR ACTIVATING A PLURALITY OF WORD LINES IN A REFRESH CYCLE, AND ELECTRONIC MEMORY DEVICE

BACKGROUND OF THE INVENTION

1. Field of the Invention

The present invention relates to electronic memory devices such as DRAMs (Dynamic Random Access Memories, dynamic read/write memories), and relates particularly to a method and apparatus for refreshing information stored in memory cells in a memory cell array.

2. Description of the Prior Art

The present invention relates specifically to an electronic memory device for storing data having a memory cell array, for example arranged in memory banks, which has memory cells and having word lines and bit lines for addressing/reading the memory cells in the memory cell array, with information stored in the memory cells in the memory cell array being refreshed by applying a predetermined activation potential at a predetermined refresh rate to the word lines.

In designing electronic memory devices which have individual memory cells for storing electrical charge, miniaturization of the relevant memory devices gives rise to problems in maintaining the charge or the stored information in the memory device, in particular.

"Retention problems", i.e. problems in retaining the stored information or the stored electrical charge, increase significantly when future production technologies such as 90-nanometer technology or 70-nanometer technology are used. In this context, the drawback arises that the memory cells formed from trench capacitors, for example, need to be produced in ever narrower and deeper form, which gives rise to leakage paths which result in a reduction in the electrical charge stored in the memory cells.

To solve this problem, the prior art has proposed numerous methods for process optimization in the manufacture of the electronic memory device. However, such methods entail considerable drawbacks with regard to yield, development time and development costs. In addition, a loss of speed for the data processing by the electronic memory apparatus may disadvantageously arise at low temperatures.

SUMMARY OF THE INVENTION

It is an object of the present invention to provide an electronic memory device for storing data in which refreshing of the information stored as charge in the memory cells is improved.

The object is achieved in accordance with the invention by means of an electronic memory device for storing data essentially, comprising: a memory cell array which is arranged in memory banks and which has memory cells; and word lines and bit lines for addressing the memory cells in the memory cell array, where information stored in the memory cells in the memory cell array can be refreshed by applying a predetermined activation potential at a predetermined refresh rate to the word lines, with all word lines in a memory bank which do not have a common bit line being able to be activated in a refresh mode.

The object is also achieved in accordance with the invention by means of a method for storing data, comprises the following steps:

a) information in the form of electrical charge is stored in memory cells in a memory cell array which has memory banks; and b) the memory cells in the memory cell array are addressed using word lines and bit lines, where information stored in the memory cells in the memory cell array is refreshed by applying a predetermined activation potential at a predetermined refresh rate to the word lines, with all word lines in a memory bank which do not have a common bit line being able to be activated in a refresh mode.

A fundamental concept of the invention involves an increased number of word lines (in comparison with the prior art) in a memory bank which forms part of an electronic memory apparatus being activated simultaneously in order to perform a refresh procedure.

Advantageously, an increase in the number of activated word lines improves a refresh operation. It is also expedient that when the number of activatable word lines is increased the refresh rate for a refresh process can be reduced, i.e. that a time between individual refresh cycles can be increased.

If the refresh rate remains constant in comparison with the prior art, there is the advantage that better stability is achieved with regard to charge maintenance or retention. In addition, there is the advantage that electronic memory devices such as DRAMs (Dynamic Random Access Memories, dynamic read/write memories) can operate at a higher data rate if a greater amount of electrical charge is maintained in a memory cell, for example.

The inventive electronic memory device may be a 256-Mb DRAM chip with four memory banks. Preferably, the four memory banks are of the same size, i.e. they have a memory depth of 64 Mb (megabits). The memory banks may be provided from memory blocks which can be activated using a respective particular number of associated word lines. The refresh rate for a refresh process for the memory cells arranged in the memory apparatus may be 64 ms. Each of the memory blocks in the memory apparatus may have an associated separate sense amplifier block.

Information stored in the memory cells in the memory cell array may be refreshed periodically. This means that the inventive electronic memory device for storing data allows a safe refresh mode to be provided even when the structures of the individual memory cells are reduced in size.

Exemplary embodiments of the invention are illustrated in the drawings and are explained in more detail in the description below.

DESCRIPTION OF THE PREFERRED EMBODIMENTS

In the figures, identical reference symbols denote components or steps which are the same or have the same function.

Figure 1:
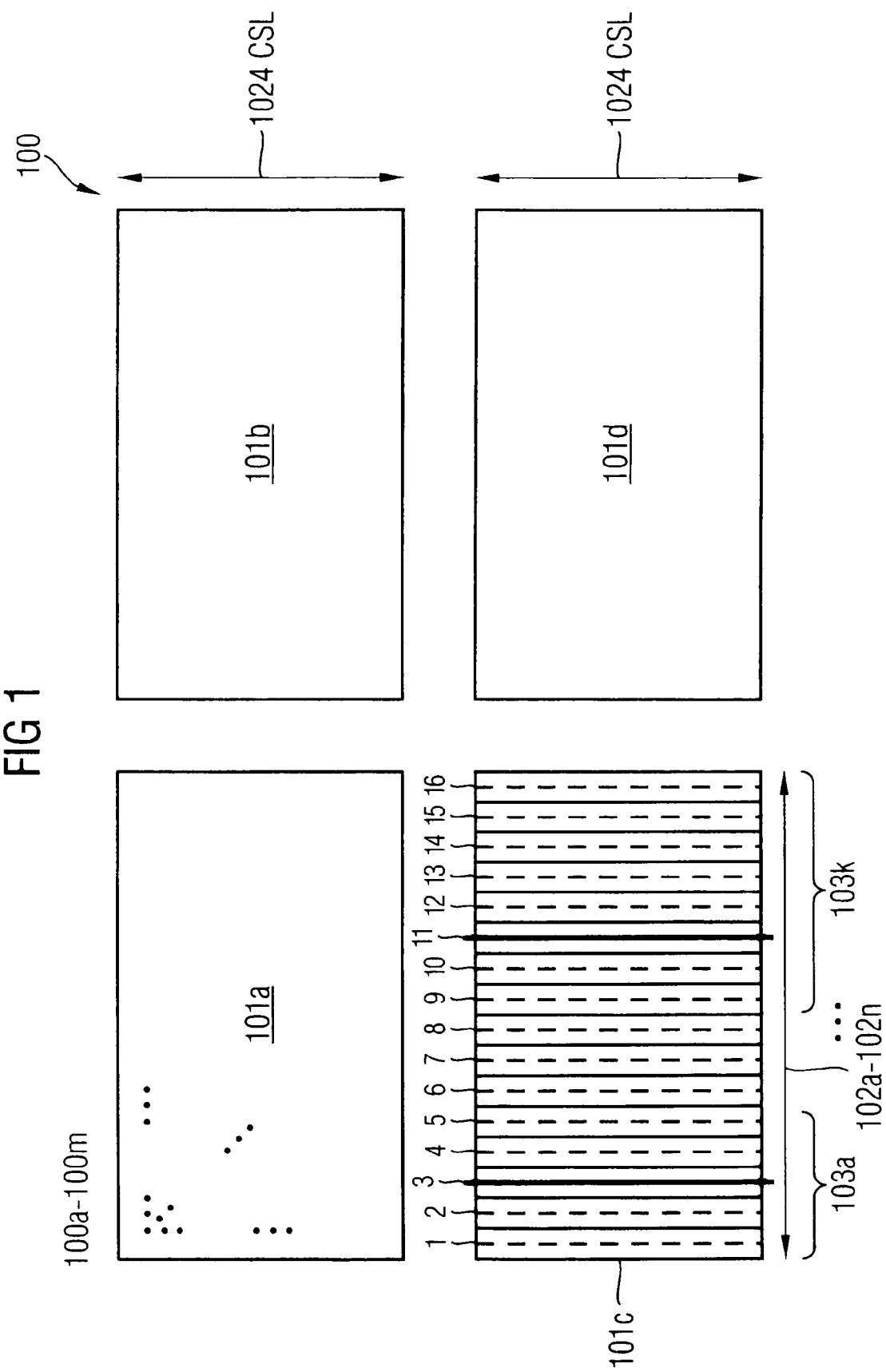
FIG. 1 is a memory cell array with memory cells arranged in memory banks in accordance with a preferred exemplary embodiment of the present invention.

FIG. 1 shows a memory apparatus which essentially comprises a memory cell array 100. Individual memory cells are shown schematically by the reference symbols 100a-100m. In line with one preferred exemplary embodiment of the present invention, which is shown in FIG. 1, the memory cell array is split into four memory banks 101a, 101b, 101c and 101d.

The memory cell array described has a total memory depth of 256 megabits (Mb), for example. If the memory depth is split evenly, each individual memory bank 101a-101d thus has a memory depth of 64 Mb. The individual memory cells are addressed/read using word lines 102a-102n and bit lines (not shown). It should be pointed out that all four memory banks 101a-101d are addressed using such word lines 102a-102n, even though FIG. 1 illustrates such a word line structure only for the memory bank 101c. In addition, the memory bank 101c (like the other memory banks 101a, 101b and 101d too) is divided into individual memory blocks, which are denoted by the reference symbols 103a, ..., 103k with reference to the memory bank 101c.

In the exemplary embodiment shown in FIG. 1, the memory blocks 103a-103k each have a memory depth of 4 megabits (Mb). Each 4-Mb memory block 103a-103k is addressed by separately associated word lines. Each of the memory banks 101a-101d thus has a number of 16 4-Mb memory blocks 103a-103k. Preferably, each of the memory blocks 103a-103k has an associated separate sense amplifier block. In line with the inventive method for storing data, a plurality of word lines now become activatable for a memory bank without there being any reciprocal influencing.

FIG. 1 thus illustrates 16 individual memory blocks using the digits 1 to 16. A number of 1024 chip selection lines CSL is provided for each memory bank in this case. In line with the prior art, only the memory blocks identified by a dashed area are activated simultaneously by the word line for the purpose of a refresh operation. In line with the inventive method, it is now possible to activate more than two word lines per memory bank (word lines which belong to more than one address).

Parallel activation of word lines which run in neighbouring 4-Mb memory blocks is thus possible. In line with the inventive method, fourteen additional activation operations for word lines are thus possible per memory bank 101a-101d in the illustrated memory apparatus in FIG. 1. Preferably, an increase in the number of activation operations results in an increase in the refresh rate (refresh frequency) for the entire memory apparatus per memory cell.

This results in a considerable improvement in the stability with regard to retention or in a much higher yield when manufacturing the memory apparatuses. It is also advantageous that latencies can be reduced, allowing a greater quantity of charge to remain in a memory cell 100a-100m in the memory cell array 100 in principle.

It should be pointed out that a certain increase in the current which is required for a refresh cycle is brought about by the inventive method.

Figure 2:
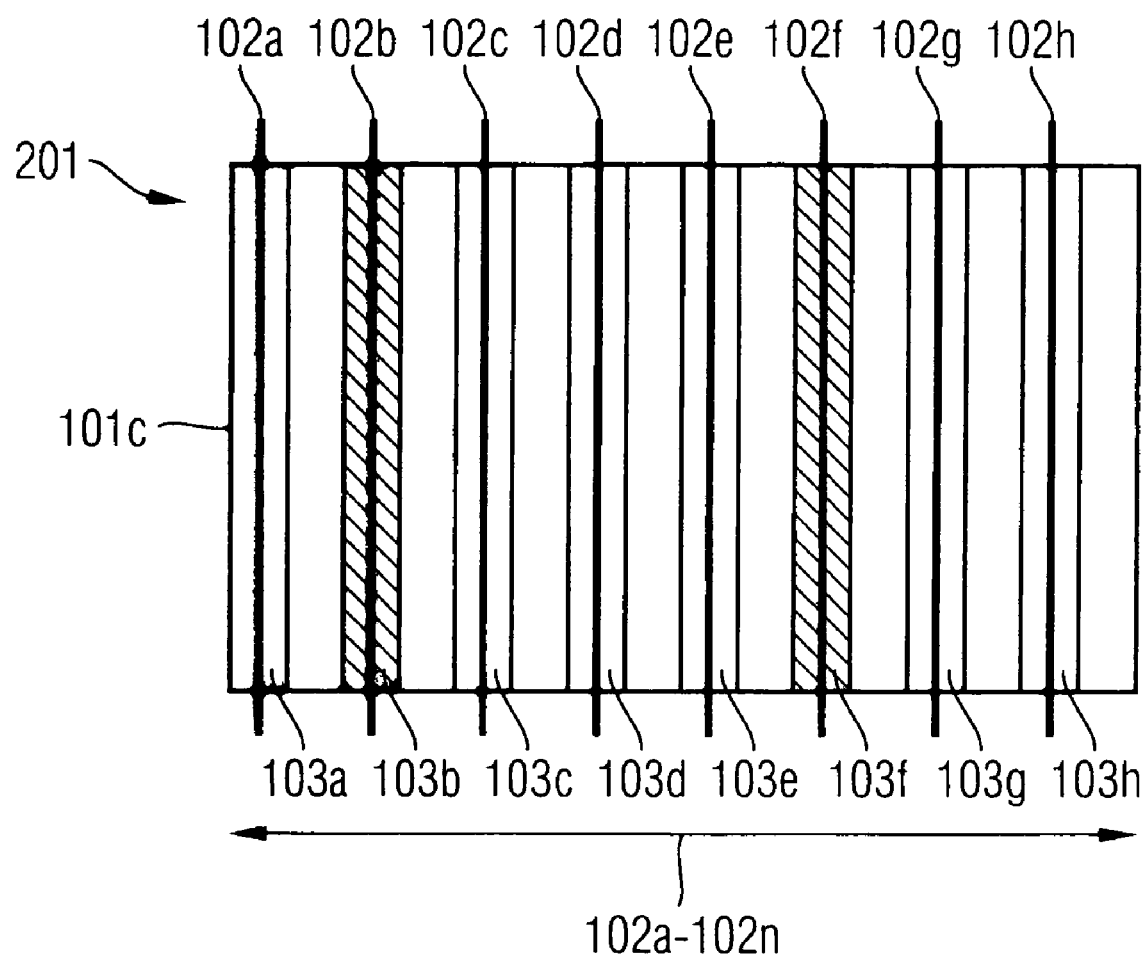
FIG. 2 is an enlarged detail of one of the memory cell array's memory banks of FIG. 1.

FIG. 2 shows an enlarged detail of one of the memory banks 101a-101d which are shown in FIG. 1. For the purpose of illustration, the memory bank 101c has been selected, with all the memory banks 101a-101d based on the preferred exemplary embodiment of the invention being of identical design.

By way of example, eight memory blocks 103a-103h are shown in the memory bank 101c illustrated in FIG. 2, these being able to be addressed or activated using appropriately associated word lines 102a-102h in order to be able to perform a refresh cycle (refresh process).

In the prior art, the memory blocks 103b and 103f shown by a shaded area in FIG. 2, for example, are normally addressed simultaneously during a refresh cycle. In line with the invention, it is now possible to address more than two memory blocks 103b, 103f per memory bank 101c, i.e. in the present case of a 64-Mb memory bank 101c a number of up to 16 memory blocks 103a-103h which each have a memory depth of 4 megabits (Mb), i.e. the inventive method for storing data allows an increase in the refresh rate for the 64-Mb memory bank by a maximum of the factor 8.

In this way, instead of the usual two memory blocks 103b, 103f in the memory bank 101c it is possible to activate up to 16 memory blocks 103 (not illustrated in FIG. 2) simultaneously. FIG. 2 shows the activation of eight memory blocks 103a-103h using appropriately associated word lines 102a-102h by way of example.

It should be pointed out that the inventive method for storing data can also be applied in corresponding fashion to memory banks with a greater or lesser memory depth than 64 Mb (megabits). A crucial factor for the application of the inventive method in this context is that information stored in the memory cells 100a-100m in the memory cell array 100 is refreshed by applying a predetermined activation potential 201 (shown only for the first word line 102a in FIG. 2) at a predetermined refresh rate t to all word lines 102a-102n, with all word lines 102a-102n in a memory bank 101a-101d which do not have a common bit line being activated in a refresh mode.

This expediently results in an increase in the refresh rate without there being any reciprocal influencing of the individual memory blocks 103a-103k during a refresh operation.

It should be pointed out (although this is not illustrated in the figures) that a total of 16 384 individual word lines (for 1024 chip selection lines CSL per memory bank) in the number of 16 4-Mb memory blocks need to be activated in the case of a 64-Mb memory bank in order to ensure that the region of the memory cell array which is arranged in a memory bank is refreshed completely.

When the number of word lines is 16 k, a total of two word lines are run up, with 8 k different addresses being provided. At a refresh rate of 64 milliseconds (ms) for a memory bank 101a-101d, the result is a refresh cycle for two word lines of:

$$64 \text{ ms}/8k = t_{refresh} = 8 \text{ }\mu\text{s} \tag{1}$$

To implement the inventive method for storing data, it is possible to ignore certain address bits. In the case of a 256-Mb memory cell array (memory chip D11), the most significant address bits (RA12:10) define that memory block among the 4-Mb memory blocks 103a-103k in which an activation operation needs to be performed.

If the refresh rate is doubled, i.e. if four instead of two word lines 102a-102n are activated, it is necessary to ignore an MSB-RA address bit. If the refresh rate is correspondingly quadrupled, i.e. if eight word lines are activated, it is necessary to ignore two of the MSB-RA address bits, whereas if it is multiplied by eight (maximum possible increase in the refresh rate for a 64-Mb memory bank 101a-101d), it is necessary to ignore three MSB-RA address bits (MSB=Most Significant Bit).

It should be pointed out that a precise specification of the address bits is dependent on the specific memory apparatus or on the DRAM memory chip and needs to be defined beforehand.

Although modifications and changes may be suggested by those skilled in the art, it is the intention of the inventors to embody within the patent warranted heron all changes and modifications as reasonably and properly come within the scope of their contribution to the art.

We claim as our invention:

1. An electronic memory device for storing data, comprising:

a memory cell array arranged in at least one memory bank and comprising memory cells in which information is stored; and word lines and bit lines for addressing and reading said memory cells of said memory cell array; said word lines being configured to refresh in a refresh mode said information stored in said memory cells of said memory cell area by applying a predetermined activation potential at a predetermined refresh rate to said word lines; all said word lines of said memory bank not having a common bit line being activated simultaneously in said refresh mode.

2. The device of claim 1, wherein said electronic memory device is a 256-Mb DRAM chip comprising four of said memory banks.

3. The device of claim 1, wherein said memory banks are provided from memory blocks being configured to be activated using a respective particular number of associated said word lines.

4. The device of claim 1, wherein said refresh rate is 64 milliseconds.

5. The device of claim 3, wherein each of said memory blocks comprises an associated separate sense amplifier block.

6. A method for storing data in memory cells, comprising the steps of:

storing information in the form of electrical charge in memory cells of a memory cell array which comprises memory banks;

addressing and reading said memory cells of said memory cell array using word lines and bit lines; and refreshing in said information stored in said memory cells of said memory cell array by applying a predetermined activation potential at a predetermined refresh rate to at least two word lines of said word lines of said memory bank; said at least two word lines not having a common bit line.

7. The method of claim 6, wherein said memory banks are provided from memory blocks being configured to be activated using a respective particular number of associated said word lines.

8. The method of claim 6, comprising refreshing said information stored in said memory cells of said memory cell array periodically.

9. The method of claim 8, comprising refreshing said information stored in said memory cells of said memory cell array at said refresh rate being 64 milliseconds.

* * * * *